United States Patent [19]

Huntington

[11] Patent Number: 4,473,758

[45] Date of Patent: Sep. 25, 1984

[54] SUBSTRATE BIAS CONTROL CIRCUIT AND METHOD

[75] Inventor: Robert C. Huntington, Phoenix, Ariz.

[73] Assignee: Motorola Inc., Schaumburg, Ill.

[21] Appl. No.: 464,163

[22] Filed: Feb. 7, 1983

[51] Int. Cl.[3] .................... H03K 17/16; H03K 17/693; H03K 19/094

[52] U.S. Cl. ................................ 307/296 R; 307/304; 307/577; 307/451

[58] Field of Search .................... 307/296 R, 451, 297, 307/304, 572, 577, 579, 585, 549–550, 200 B; 361/91

[56] References Cited

U.S. PATENT DOCUMENTS

| | | | |
|---|---|---|---|
| 3,947,727 | 3/1976 | Stewart | 361/91 |
| 4,044,373 | 8/1977 | Nomiya et al. | 357/49 X |
| 4,049,980 | 9/1977 | Maitland | 307/297 X |
| 4,066,918 | 1/1978 | Heuner et al. | 361/91 X |
| 4,260,909 | 4/1981 | Dumbri et al. | 365/228 x |
| 4,264,941 | 4/1981 | London | 361/91 |

*Primary Examiner*—Larry N. Anagnos
*Assistant Examiner*—David R. Hudspeth
*Attorney, Agent, or Firm*—William J. Kubida

[57] ABSTRACT

An integrated circuit and method includes a substrate bias voltage control circuit formed on a common substrate therewith for ensuring that the substrate has a voltage applied thereto while a semiconductor device on the substrate has a supply voltage applied thereto which includes means for providing sources of bias and supply voltages to the substrate with means for firstly coupling the bias voltage to the substrate when the bias voltage is present and means for secondly coupling the supply voltage to the substrate when the bias voltage is not present.

19 Claims, 2 Drawing Figures

SUBSTRATE BIAS CONTROL CIRCUIT AND METHOD

BACKGROUND OF THE INVENTION

The present invention relates, in general, to substrate bias control circuits and methods. More particularly, the present invention relates to the aforesaid circuits and methods which are of especial utility in controlling the application of supply and substrate voltages to CMOS devices utilizing separate voltage levels therefor.

Scaled CMOS devices, those having a channel length on the order of 1.25 microns, require a reduced power supply ($V_{CC}$) for proper operation. That is, as channel lengths have decreased, a concomitantly reduced power supply voltage level is mandated in order to avoid excessive drain voltage reduction of the short channel device threshold voltage. However, such a reduced supply level (in the 3.0 volt range) prevents acceptance of more conventional 5.0 volt input logic swings when conventional CMOS input protection structures are used. It follows that with the 3.0 volt $V_{CC}$ supply connected to the N type substrate, as is conventional in CMOS technology, the use of a PN diode in the input protection circuitry would be precluded. Therefore, a novel technique for applying a 5.0 volt ($V_{BB}$) substrate bias to the scaled CMOS circuit has been proposed which retains the PN diode of the input protection circuitry and still allows a 5.0 volt input logic swing to be applied thereto. A more detailed description of this technique is given in U.S. patent application Ser. No. 452,532 as filed on Dec. 23, 1982 by Charles S. Meyer and assigned to the assignee of the present invention. However, when using a 5.0 volt substrate bias voltage and a separate 3.0 volt supply voltage for these small geometry CMOS devices, it is necessary that the substrate voltage be applied before the supply voltage. Should the substrate not be biased before the supply voltage is applied, damage could result to the chip due to the forward biasing of the gate protection diode and the source to substrate junctions in the P channel devices. Typically, conventional CMOS structures have the substrate directly connected internally to the $V_{CC}$ supply to assure that substrate bias is applied whenever the device is powered up.

It is therefore an object of the present invention to provide an improved substrate bias control circuit and method.

It is further an object of the present invention to provide an improved substrate bias control circuit and method which allows separate circuit supply and substrate bias voltages to be applied or removed in either sequence without resultant chip damage.

It is still further an object of the present invention to provide an improved substrate bias control circuit and method which allows for chip operation on the circuit supply voltage only, in the absence of a substrate bias voltage, by connecting the substrate to the supply voltage until substrate voltage is applied.

It is still further an object of the present invention to provide an improved substrate bias control circuit and method which allows for isolation between sources of circuit supply and substrate bias voltage supply.

It is still further an object of the present invention to provide an improved substrate bias control circuit and method which is simply implemented requiring only nominal on-chip area.

It is still further an object of the present invention to provide an improved substrate bias control circuit and method which dissipates very little circuit power.

SUMMARY OF THE INVENTION

The foregoing and other objects are achieved in the present invention wherein there is provided is an integrated circuit including a substrate bias voltage control circuit formed on a common substrate therewith for ensuring that the substrate has a voltage applied thereto while a semiconductor device on the substrate has a supply voltage applied thereto which comprises means for providing sources of bias and supply voltages to the substrate. Also included are means for firstly coupling the bias voltage to the substrate when the bias voltage is present and means for secondly coupling the supply voltage to the substrate when the bias voltage is not present.

Also provided is a method for insuring that an integrated circuit substrate has a voltage applied thereto while a semiconductor device on the substrate has a supply voltage applied thereto which comprises the steps of providing sources of bias and supply voltages to the substrate while firstly coupling the bias voltage to the substrate when the bias voltage is present and secondly coupling the supply voltage to the substrate when the bias voltage is not present.

BRIEF DESCRIPTION OF THE DRAWINGS

The above mentioned and other features and objects of the invention and the manner of attaining them will become more apparent and the invention itself will be best understood by reference to the following description of an embodiment of the invention taken in conjunction with the accompanying drawings, wherein.

DESCRIPTION OF A PREFERRED EMBODIMENT

Figure 1:
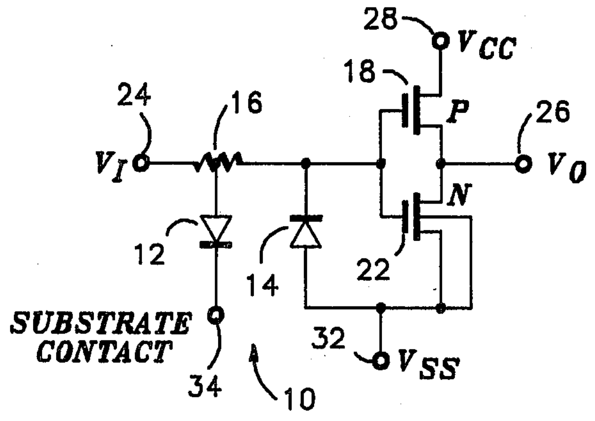
FIG. 1 is a simplified schematic representation of a typical input protection circuit to a CMOS inverter for use in conjunction with the present invention.

Referring now to FIG. 1, a CMOS input protection circuit 10 for use in conjunction with the present invention is shown. CMOS input protection circuit 10 comprises integrated circuitry for protecting a CMOS inverter, comprising P channel transistor 18 and N channel transistor 22, from excessive voltage inputs appearing on $V_I$ line 24. $V_I$ line 24 is coupled to the common connected gates of P channel transistor 18 and N channel transistor 22 through diffused resistor 16. A diode 12 is formed at the interface of diffused resistor 16 with the integrated circuit substrate. A source of substrate biasing voltage may be applied to the cathode of diode 12 through substrate contact 34. In a conventional CMOS input protection circuit, substrate contact 34 would be connected to a source of supply voltage ($V_{CC}$). However, substrate contact 34 may also be connected to a source of substrate bias voltage ($V_{BB}$) as disclosed and claimed in U.S. patent application Ser. No. 452,532 as filed on Dec. 23, 1982 by Charles S. Meyer and assigned to the assignee of the present invention. In this latter instance, substrate contact 34 may comprise an N+ diffusion within an N type substrate.

An additional diode 14, having its cathode connected to the gates of P channel transistor 18 and N channel transistor 22, couples these gates to $V_{SS}$ line 32. In general, $V_{SS}$ line 32 is held at a ground potential with respect to $V_{CC}$ and $V_{BB}$. A source of supply voltage ($V_{CC}$) is applied to the source of P channel transistor 18, which has its drain connected to the drain of N channel transistor 22. The source and P type well in which N channel transistor 22 is formed is connected to $V_{SS}$ line 32. An output signal appearing at the common connected drains of P channel transistor 18 and N channel transistor 22 is applied to $V_O$ line 26.

In the utilization of CMOS input protection circuit 10, with substrate contact 34 connected to a source of $V_{BB}$ of 5.0 volts, it can be seen that an input signal on $V_I$ line 24 can't go more positive than one diode drop above the level of 5.0 volts without turning on diode 12. Thus, a five-volt input swing appearing on $V_I$ line 24 can be applied to the inverter comprising P channel transistor 18 and N channel transistor 22 even with a $V_{CC}$ level of 3.0 volts, as is the case when utilizing scaled CMOS circuitry. However, it is necessary that the voltage applied to substrate contact 34 be applied before the supply voltage $V_{CC}$. In conventional CMOS technology this is accomplished by supplying $V_{CC}$ to substrate contact 34 in order to bias the substrate. Should the supply voltage $V_{CC}$ be applied before a biasing voltage is applied to substrate contact 34, damage will result to the integrated circuit resulting from forward biasing gate protection diode 12 as well as the source of substrate junctions of the P channel transistors such as P channel transistor 18.

Figure 2:
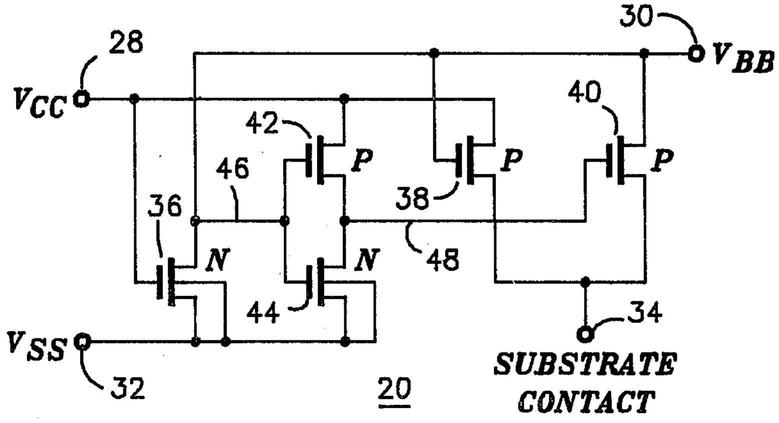
FIG. 2 is a schematic representation of a preferred embodiment of the present invention for use in controlling the application of supply and substrate voltages to an integrated circuit.

Referring additionally now to FIG. 2, a substrate bias voltage control circuit 20 for controlling application of a bias voltage to substrate contact 34 is shown. Substrate bias voltage control circuit 20 independently couples a source of substrate bias voltage ($V_{BB}$) as well as a source of supply voltage ($V_{CC}$) to substrate contact 34. As illustrated, an N channel transistor 36 has its source contact connected to $V_{SS}$ line 32 and its drain contact connected to $V_{BB}$ line 30. The gate electrode of N channel transistor 36 is connected to $V_{CC}$ line 28. The drain contact of N channel transistor 36 defines a node 46. It will be noted that node 46 is electrically common with $V_{BB}$ line 30 but will be referred to as node 46 for purposes of clarity.

Signals appearing on node 46 are applied to the input of a conventional CMOS inverter comprising P channel transistor 42 in series with N channel transistor 44. This inverter is supplied by $V_{CC}$ line 28 with respect to ground which is $V_{SS}$ line 32. The output appearing at the common connected drains of P channel transistor 42 and N channel transistor 44 is applied to node 48 and connected to the gate of P channel transistor 40. P channel transistor 40 has its source connected to $V_{BB}$ line 30 and its drain connected to substrate contact 34. The drain of P channel transistor 38 is also connected to substrate contact 34 and has its source contact connected to $V_{CC}$ line 28. The gate of P channel transistor 38 is connected to $V_{BB}$ line 30.

$V_{CC}$ only and $V_{SS}$ are applied:

In operation, 3.0 volts is applied to $V_{CC}$ line 28, the inverter comprising P channel transistor 42 and N channel transistor 44, and the gate of N channel transistor 36. This causes the channel of N channel transistor 36 to invert which grounds the device gates connected to node 46. As a result, P channel transistor 38 conducts and connects the 3.0 volts appearing on $V_{CC}$ line 28 to substrate contact 34, and P channel transistor 42 conducts which raises node 48 to 3.0 volts which holds P channel transistor 40 off. The chip now can function with its substrate bias equal to the 3.0 volts appearing on $V_{CC}$ line 28 and will perform satisfactorily providing a logic swing appearing on $V_I$ line 24 does not exceed 3.0 volts in amplitude.

$V_{CC}$ and $V_{BB}$ and $V_{SS}$ are applied:

If 5.0 volts is then applied to $V_{BB}$ line 30, node 46 is raised to 5.0 volts which turns P channel transistors 38 and 42 off and turns N channel transistor 44 on to drive node 48 to ground, or $V_{SS}$. This causes P channel transistor 40 to conduct and connects 5.0 volts to substrate contact 34. Note that N channel transistor 36 continues to conduct with $V_{DS}$ equal to 5.0 volts, but N channel transistor 36 is designed with a very long and narrow channel (a very low Z/L ratio) and will dissipate a predetermined very low current. The two voltage supplies $V_{CC}$ and $V_{BB}$ are effectively decoupled by holding the gate of P channel transistor 38 at the higher voltage to hold the device in nonconduction.

The transient switching between substrate voltage control from $V_{CC}$ to $V_{BB}$ may be considered as that condition when $V_{CC}$ is held at a constant 3.0 volts and $V_{BB}$ is ramped from 0 to 5.0 volts. This condition occurs when the $V_{BB}$ supply is turned on while the $V_{CC}$ supply is on. As long as $V_{BB}<V_{TN}$, N channel transistor 44 is off. When $V_{TN}<V_{BB}<(V_{CC}+V_{TP})$ both P channel transistor 42 and N channel transistor 44 are on and act as a voltage divider. Because of the relative values of their Z/L ratios, Node 48 is held close to $V_{CC}$, which holds P channel transisor 40 off, while P channel transistor 38 remains on. When $V_{BB}>(V_{CC}+V_{TP})$, both P channel transistors 38 and 42 are off, node 48 goes to ground, P channel transistor 40 is turned on, and the substrate voltage is determined by $V_{BB}$. At the instant $V_{BB}$ exceeds $(V_{CC}+V_{TP})$, P channel transistor 42 and N channel transistor 44 effectively change from a voltage divider to an inverter, and control of the substrate voltage is switched from $V_{CC}$ to $V_{BB}$.

From the above, it can be seen that the Z/L ratios of P channel transistor 42 and N channel transistor 44 must have widely different values. The Z/L ratios for P channel transistors 38 and 40 should provide an acceptably low channel voltage drop under conditions of maximum anticipated substrate current. (450/1.25 has been found to be satisfactory). The Z/L ratios for N channel transistors 36 and 44 will provide acceptably low current dissipation at approximately 6/80. Layout is simplified by using the same Z/L ratio for P channel transistor 42 as that for P channel transistors 38 and 40.

$V_{BB}$ only and $V_{SS}$ are applied:

5.0 volts is applied to the gate of N channel transistor 44 which causes its channel to invert thereby grounding node 48. This causes P channel transistor 40 to conduct and connects 5.0 volts to substrate contact 34. With 5.0 volts on its gate, P channel transistor 38 is held off, which decouples the 5.0 volts from the remainder of the circuit.

If 3.0 volts is then applied to $V_{CC}$ line 28, node 46 and node 48 voltages are unchanged and the states of P channel transistor 38 and P channel transistor 40 remain as they were prior to the application of the 3.0 volts. However, N channel transistor 36 is turned on and conducts a very low current as previously described. Again, P channel transistor 38 is held off with 5.0 volts on its gate to isolate the two applied voltages from each other.

$V_{CC}$ and $V_{BB}$ (no $V_{SS}$) are applied:

In this case, with no $V_{SS}$, node 48 voltage is indeterminate. However, no matter what voltage node 48 might assume, P channel transistor 38 will continue to be held off because its gate is held at the higher of the two applied voltages, i.e. $V_{BB}$. This will assure isolation of the two voltages from each other.

If $V_{SS}$ is then applied, normal operation will occur as described previously.

P channel transistor 38 and P channel transistor 40 are designed with very large Z/L ratios in order that their source-to-drain voltage drop (operating in the linear region) will be negligibly small for maximum anticipated substrate current. As described previously, the designed Z/L ratio for N channel transistor 36 will be sufficiently small to hold the drain current in this device to an acceptably low value.

It should be noted, that the 3.0 volt $V_{CC}$ and 5.0 volt $V_{BB}$ values are given only as an example, because, within voltage limitations of the transistors themselves, this circuit will function with any two voltages. It should be noted, that in normal usage the substrate bias voltage will never be less than the supply voltage under steady-state conditions.

What has been provided therefore is an improved substrate bias control circuit and method which allows separate circuit supply and substrate bias voltages to be applied or removed in either sequence without resulting chip damage. The circuit and method of the present invention allows for an integrated circuit chip operation on the circuit supply voltage only, in the absence of a substrate bias voltage, by connecting the substrate to the supply voltage until substrate voltage is applied. The circuit and method of the present invention further allow for isolation between sources of circuit supply and substrate bias voltage supply. Still further, the improved substrate bias control circuit and method of the present invention are simply implemented requiring only nominal on-chip area while concomitantly dissipating very little circuit power.

While there have been described above the principles of this invention in conjunction with specific apparatus, it is to be clearly understood that this description is made only by way of example and not as a limitation to the scope of the invention.

What is claimed is:

1. An integrated circuit including a bias voltage control circuit formed on a common substrate therewith for insuring that the substrate has a voltage applied thereto while a semiconductor device on said substrate has a supply voltage applied thereto comprising:

means for providing sources of bias and supply voltages of said substrate;

first means for coupling said bias voltage to said substrate when said bias voltage is present; and second means for coupling said supply voltage to said substrate when said bias voltage is absent.

2. The integrated circuit of claim 1 wherein said first means for coupling further comprises:

means for decoupling said bias voltage providing means from said substrate when said bias voltage is absent.

3. The integrated circuit of claim 1 wherein said second means for coupling further comprises:

means for decoupling said supply voltage providing means from said substrate when said bias voltage is present.

4. The integrated circuit of claim 1 wherein said semiconductor device comprises a CMOS inverter.

5. The integrated circuit of claim 1 wherein said bias and supply voltages are substantially 5.0 and 3.0 volts respectively.

6. The integrated circuit of claim 1 wherein said substrate comprises N type semiconductor material.

7. The integrated circuit of claim 1 wherein said first and second coupling means comprises MOS transistors.

8. The integrated circuit of claim 7 wherein said MOS transistors are P channel devices.

9. The integrated circuit of claim 2 wherein said decoupling means comprises a CMOS inverter.

10. A method for insuring that an integrated circuit substrate has a voltage applied thereto while a semiconductor device on said substrate has a supply voltage applied thereto comprising the steps of:

providing sources of bias and supply voltages to said substrate;

firstly coupling said bias voltage to said substrate when said bias voltage is present; and secondly coupling said supply voltage to said substrate when said bias voltage is absent.

11. The method of claim 10 wherein said step of secondly coupling further comprises the step of:

decoupling said bias voltage source from said substrate.

12. The method of claim 10 wherein said step of firstly coupling further comprises the step of:

decoupling said supply voltage source from said substrate.

13. The method of claim 10 wherein said step of providing is carried out by means of a bias voltage of 5.0 volts and a supply voltage of 3.0 volts.

14. The method of claim 12 wherein said steps of firstly and secondly coupling are carried out by means of MOS transistors.

15. The method of claim 14 wherein said MOS transistors are P channel devices.

16. The method of claim 11 wherein said step of decoupling said bias voltage source is carried out by means of a CMOS inverter.

17. A substrate bias voltage control circuit comprising:

first switching means coupling a substrate bias voltage bus to a circuit ground, said first switching means having a first input thereof connected to a supply voltage bus, inverter means connected between said supply voltage bus and said circuit ground, said inverter means having an input node thereof connected to said substrate bias voltage bus and an output node thereof, and second and third switching means coupling said supply and substrate bias voltage buses respectively to a substrate contact point, said second switching means having a second input thereof connected to said substrate bias voltage bus and said third switching means having a third input thereof connected to said output node.

18. The substrate bias voltage control circuit of claim 17 wherein said first, second and third switching means comprise MOS transistors.

19. The substrate bias voltage control circuit of claim 18 wherein said first switching means comprises an N channel device, said second and third switching means comprise P-channel devices and said inverter means comprises a CMOS inverter.

* * * * *